United States Patent
Bäse et al.

(10) Patent No.: US 10,171,840 B2
(45) Date of Patent: *Jan. 1, 2019

(54) METHOD FOR PRODUCING VIDEO CODING AND PROGRAMME-PRODUCT

(71) Applicant: Siemens Aktiengesellschaft, Munich (DE)

(72) Inventors: Gero Bäse, Munich (DE); Norbert Oertel, Landshut (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 0 days.

This patent is subject to a terminal disclaimer.

(21) Appl. No.: 15/859,349

(22) Filed: Dec. 30, 2017

(65) Prior Publication Data

US 2018/0124430 A1     May 3, 2018

Related U.S. Application Data

(63) Continuation of application No. 15/148,606, filed on May 6, 2016, now Pat. No. 98,605,648, which is a
(Continued)

(30) Foreign Application Priority Data

Sep. 14, 2001   (DE) ................................. 101 45 373
Apr. 25, 2002   (DE) ................................. 102 18 541

(51) Int. Cl.
*H04N 7/12*     (2006.01)
*H04N 11/02*   (2006.01)
(Continued)

(52) U.S. Cl.
CPC .......... *H04N 19/61* (2014.11); *H03M 7/4006* (2013.01); *H04N 19/13* (2014.11);
(Continued)

(58) Field of Classification Search
USPC ....................................................... 375/240.18
See application file for complete search history.

(56) References Cited

U.S. PATENT DOCUMENTS

| 5,400,075 A | 3/1995 | Savatier | ................... 375/240.23 |
| 5,721,822 A | 2/1998 | Agarwal | ......................... 710/68 |

(Continued)

FOREIGN PATENT DOCUMENTS

| WO | 03/026307 A2 | 3/2003 | ............... G06T 9/00 |
| WO | 03/027940 A1 | 4/2003 | ............... G06T 9/00 |

OTHER PUBLICATIONS

Rissanen, "Xp-000563277: A Universal Data Compression System," IEEE Transactions on Information Theory, pp. 656-664, Sep. 1, 1983.

(Continued)

*Primary Examiner* — Chikaodili E Anyikire
(74) *Attorney, Agent, or Firm* — Slayden Grubert Beard PLLC

(57) ABSTRACT

According to the invention, there are provided sets of contexts specifically adapted to encode special coefficients of a prediction error matrix, on the basis of previously encoded values of level k. Furthermore, the number of values of levels other than 0 is explicitly encoded and numbers of appropriate contexts are selected on the basis of the number of spectral coefficients other than 0.

10 Claims, 3 Drawing Sheets

Related U.S. Application Data continuation of application No. 10/489,651, filed as application No. PCT/DE02/03385 on Sep. 11, 2002, now Pat. No. 9,356,620.

(51) Int. Cl.
*H04N 11/04* (2006.01)
*H04N 19/61* (2014.01)
*H03M 7/40* (2006.01)
*H04N 19/13* (2014.01)
*H04N 19/517* (2014.01)
*H04N 19/176* (2014.01)
*H04N 19/62* (2014.01)
*H04N 19/91* (2014.01)

(52) U.S. Cl.
CPC ......... *H04N 19/176* (2014.11); *H04N 19/517* (2014.11); *H04N 19/62* (2014.11); *H04N 19/91* (2014.11)

(56) References Cited

U.S. PATENT DOCUMENTS

| | | | |
|---|---|---|---|
| 5,764,374 A | 6/1998 | Seroussi et al. | 382/244 |
| 5,818,877 A * | 10/1998 | Tsai | H03M 7/40 375/241 |
| 5,991,449 A | 11/1999 | Kimura et al. | 382/238 |
| 6,856,701 B2 | 2/2005 | Karczewicz et al. | 382/247 |
| 6,895,120 B2 | 5/2005 | Satoh et al. | 382/240 |
| 6,950,558 B2 | 9/2005 | Schwartz et al. | 382/240 |
| 7,187,804 B2 | 3/2007 | Zhao et al. | 382/244 |
| 7,421,137 B2 | 9/2008 | Taubman | 382/240 |
| 9,356,620 B2 | 5/2016 | Bäse et al. | |
| 9,860,564 B2 | 1/2018 | Baese et al. | |
| 2004/0233992 A1 | 11/2004 | Base et al. | 375/240.18 |

OTHER PUBLICATIONS

Sipitca, et al., "XP-010530772: Conditional OCT Event Coding without Side Information in Video Compression," Image Processing, pp. 944-947, Sep. 10, 2000.

Marpe, et al., "XP-002264756: Adaptive Codes for H.26L," ITU Telecommunications Standardization Sector VCEG-M59, pp. 1-7, Mar. 28, 2001.

Kuceren, et al., "XP-002264758: Improvements on CABAC," ITU Telecommunications Standardization Sector, pp. 1-4, Sep. 24, 2001.

Base, et al., "XP-002264757: Enhanced Coding of Coefficients," ITU Communications Standardization Sector, pp. 1-2, Dec. 4, 2001.

Marpe, et al., "XP-002257293: Improved CABAC," ITU Telecommunications Standardization Sector, pp. 1-6, Dec. 4, 2001.

* cited by examiner

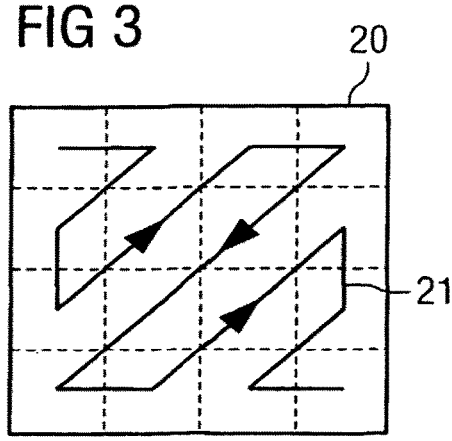
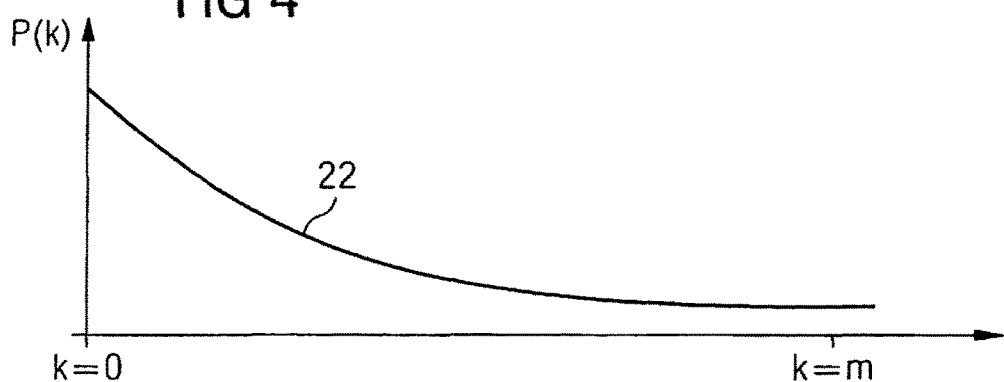
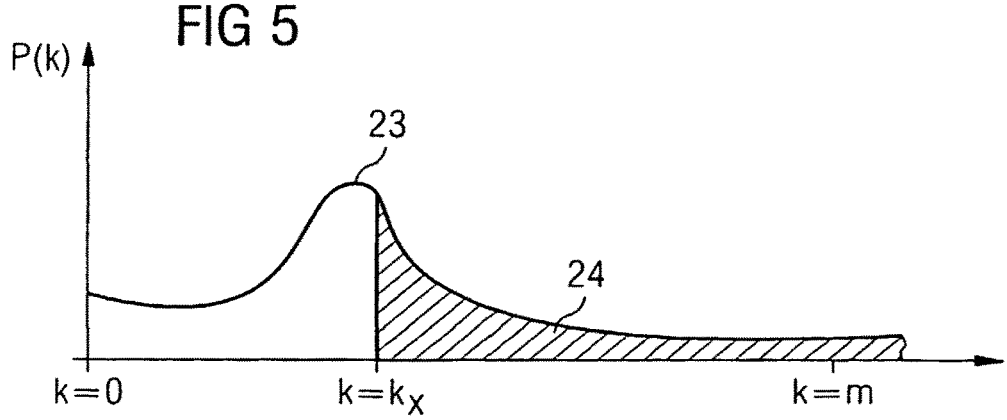

| | 1st bit | 2nd bit | 3rd bit | Leading sign | |
|---|---|---|---|---|---|
| k=1 | p(0); p(1) | | | p(0); p(1) | ← LevelContext-Set(k=1) |
| k=2 | p(0); p(1) | p(0); p(1) | | p(0); p(1) | |
| k=3 | p(0); p(1) | p(0); p(1) | p(0); p(1) | p(0); p(1) | |
| k=4 | p(0); p(1) | p(0); p(1) | p(0); p(1) | p(0); p(1) | |

| | 1st bit | 2nd bit | 3rd bit | 4th to nth bit | |
|---|---|---|---|---|---|
| p=0 | p(0); p(1) | p(0); p(1) | p(0); p(1) | p(0); p(1) | ← RunContext-Set(p=0) |
| p=1 | p(0); p(1) | p(0); p(1) | p(0); p(1) | p(0); p(1) | |
| p=2 | p(0); p(1) | p(0); p(1) | p(0); p(1) | p(0); p(1) | |
| ⋮ | | | | | |
| p=15 | p(0); p(1) | p(0); p(1) | p(0); p(1) | p(0); p(1) | |

METHOD FOR PRODUCING VIDEO CODING AND PROGRAMME-PRODUCT

CROSS-REFERENCE TO RELATED APPLICATIONS

This application is a continuation of U.S. patent application Ser. No. 15/148,606 filed on May 6, 2016, which is a continuation of U.S. patent application Ser. No. 10/489,651 filed on Mar. 15, 2004, which is a U.S. National Stage Application of International Application No. PCT/DE02/03385 filed Sep. 11, 2002, which designates the United States of America, and claims priority to DE Application No. 102 18 541.7 filed Apr. 25, 2002 and DE Application No. 101 45 373.6 filed Sep. 14, 2001, the contents of which are hereby incorporated by reference in their entirety.

BACKGROUND OF THE INVENTION

Predictive video encoding procedures use areas of an image already transmitted to estimate the current image information and calculate a prediction error which deviates therefrom. As a rule, the current image information is determined from the image areas already transmitted by dividing the current input image into blocks and by looking for blocks in previous images that correspond to each of these blocks, which minimizes the extent of an error or a gap. The block image constructed in this way is subtracted from the current input image and the prediction error thus calculated is transformed via a discrete cosine transformation or an integer transformation from the local into the frequency range. The transformed prediction error data is then quantized and the coefficients thus produced are compressed and sent to the recipient by a Context Adaptive Binary Arithmetic Coder (CABAC).

For arithmetic encoding, the coefficients contained in the prediction error matrix are linearized by coefficient sampling and converted into a series of levels and lengths of zero sequences. Both the level values and the length values are represented here as unary values and encoded independently of each other bit-by-bit. The leading signs of the levels are encoded separately. For encoding the level values, a specific context is used in each case for the first two bits and a further specific context is used for all following bits. Context in this connection should be understood as the distribution of the frequencies of the logical 0s and 1s. The context thus specifies the likelihood that a bit is set or not set. For encoding the length values, a specific context is used for the first bit and a further specific context is used for all following bits. A separate context is also used for encoding the leading sign which is represented by a individual bit. The six specific contexts used together make up a context set.

Using this prior art as a starting point, an object of the present invention is to further improve context-adaptive binary arithmetic encoding.

SUMMARY OF THE INVENTION

In accordance with the present invention, such object is achieved by a method with the following steps:
providing of a prediction error matrix;
converting of the prediction error matrix by coefficient sampling into a series of symbols; and
performing context-adaptive arithmetic encoding of the symbols on the basis of symbol frequencies, for which the distribution is selected depending on an already encoded symbol.

The present invention is based on the knowledge that there are statistical dependencies between consecutive symbols since large coefficient values occur predominantly at the start of coefficient sampling. The statistical dependencies between the symbols can be exploited by, depending on the symbols transmitted beforehand, using specific distributions of the symbol frequencies as a basis for context-adaptive arithmetic encoding. In contrast to the prior art, the distributions of the symbol frequencies used for encoding are not solely selected depending on the position of the symbol to be encoded within the symbol sequence, but also depending on a symbol actually transferred previously in each case.

In a preferred embodiment, the prediction error matrix is converted by coefficient sampling into a series of levels and lengths and the level values encoded depending on the value of a previously transmitted level and the length values depending on the value of a previously encoded length.

It should be pointed out that level value in this context should be taken as the amount of a level. Since the lengths cannot assume negative values, the length values are occasionally referred to below as lengths for short.

Since the statistical dependencies between the level values and length values are particularly prominent, this procedure makes particularly efficient encoding possible.

In a further preferred embodiment, the levels are sorted according to size and the statistical dependencies between the level values thus strengthened.

Finally, there is provision for determining and encoding the number of coefficients. This procedure also allows the selection of the frequency distribution for encoding the symbols to be made depending on the number of coefficients.

Additional features and advantages of the present invention are described in, and will be apparent from, the following Detailed Description of the Invention and the Figures.

BRIEF DESCRIPTION OF THE FIGURES

FIG. 3 shows a diagram exemplifying the sampling process of the prediction error matrix.
FIG. 4 shows a global frequency distribution of the level values.
FIG. 5 shows a frequency distribution of the level values depending on the previous level value.
FIG. 6 shows an illustration of a context set used for encoding the level values.
FIG. 7 shows an illustration of a context set used for encoding the lengths.

DETAILED DESCRIPTION OF THE INVENTION

Figure 1:
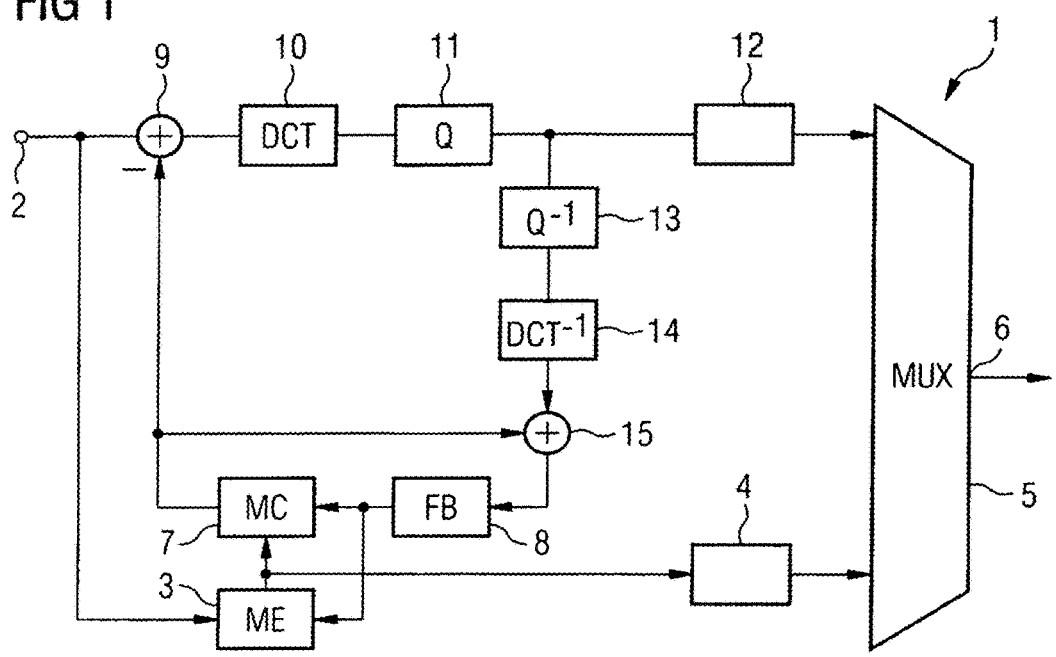
FIG. 1 shows a block diagram of an encoder.

FIG. 1 shows an encoder 1 which operates in accordance with the principle of the movement-compensating hybrid encoding. The encoder 1 has an input 2 via which the video data is fed to encoder 1. A movement estimation unit 3 downstream from input 2 segments a current image of the video data stream to be encoded into rectangular macro blocks. For each of these macro blocks, the movement estimation unit 3 looks for matching macro blocks from the images already transmitted and calculates their movement vectors. The movement vectors can be encoded with the aid of an encoding unit 4 and embedded via a multiplexer 5 into a bit stream output at an output 6. The movement vectors of the macro blocks calculated by the movement estimation unit 3 are also notified to a movement compensator 7 which, starting from the images already transmitted stored in an image memory, 8 calculates the prediction image produced by the movement of the macro blocks of the images already transmitted. This prediction image is subtracted in a subtractor 9 from the original image in order to create a prediction error which is fed to a discrete cosine transformer 10 with downstream quantizer 11. The forecasting error is also referred to as the prediction error or texture. The transformed and quantized prediction error is forwarded to a further context-sensitive encoding unit 12 which converts the prediction error matrix with the aid of context-adaptive binary arithmetic encoding into a bit stream which is fed into the multiplexer 5 and is embedded into the bit stream output at the output 6.

Processing in the discrete cosine transformer 10 converts the macro blocks with, for example, 8×8 pixels into a prediction error matrix with 8×8 spectral coefficients. In this case, the first coefficient is given the average brightness of the macro block. The first coefficient is also referred to as the direct component. The remaining spectral coefficients reflect higher frequency components of the brightness distribution with increasing index number, which is why they are referred to as alternating components.

The data rate is further reduced by the subsequent quantizer 11. With planar image elements; the prediction error only changes slowly from pixel to pixel so that, after processing in quantizer 11, most of the high-frequency spectral coefficients are equal to zero and thus do not even have to be transmitted.

The quantizer 11 additionally takes account of psychovisual effects. The human brain perceives low-frequency image components (namely, extended areas of image components) far more clearly than high-frequency image components; in particular, details. Thus, the high-frequency spectral coefficients will be quantized more roughly than the low-frequency spectral coefficients.

To correct the images stored in the image memory 8, the spectral coefficients will be fed to an inverse quantizer 13 and an inverse discrete cosine transformer 14 and the data reconstructed from the prediction error matrix in this way added in an adder 15 to the prediction image created by the movement compensator 7. The image thus created corresponds to the image produced on decoding. This image is stored in the image memory 8 and is used by the movement estimation unit 3 as a basis for calculating the movement vectors of the following images.

The function of the context-sensitive encoding unit 12 is described below on the basis of FIGS. 2 through 7.

Figure 2:
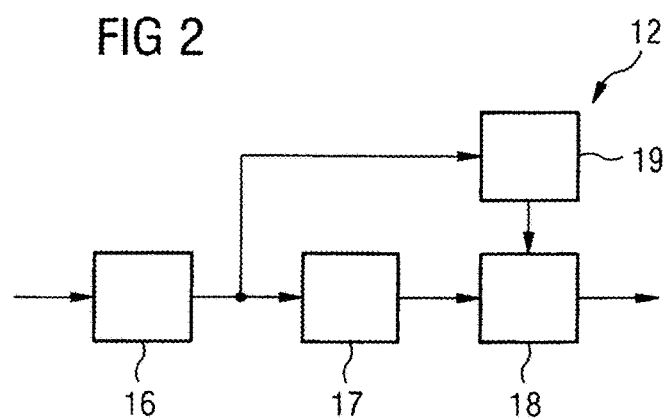
FIG. 2 shows a block diagram which illustrates the encoding of coefficients of a prediction error matrix.

The context-sensitive encoding unit shown in FIG. 2 has a sampling device via which the spectral coefficients in the transformed prediction error matrix are converted into a series of levels and lengths of zeros. This type of diagram is also referred to as a run/level diagram. The sampling device 16, for example, converts the series of spectral coefficients 20-1001000000 into the series (0/2) (1/−1) (2/1) (0/0). In this case, the number before the forward slash specifies the number of zeros before the level specified after the forward slash. The numbers before the forward slash are referred to as lengths. The 0 specified in the last number pair after the forward slash identifies the situation where the rest of the sequence of digits consists purely of zeros. The last pair of digits can be viewed as an entry identifying the end of the block transmission (EOB=End of Block).

The sequence of levels and lengths created by the sampling unit 16 is fed to a converter 17 which converts the binary representation into a unary (single value) representation. In this case, the pairs of numbers listed in the example are encoded, in each case, in this sequence level, length of sequence of zeros and leading sign of the level. The pair of numbers (0/2) will then be converted in this case into the unary sequence 110/0/0 and the pair of numbers (1/1) into the sequence 10/10/1.

The unary sequence of digits is finally fed to an arithmetic encoder 18 which performs the actual context-adaptive arithmetic encoding. To perform the context-adaptive arithmetic encoding, the arithmetic encoder 18 needs the frequency with which the ones and zeros have occurred or within the unary data stream delivered by a converter 17 in each case. This probability and thereby the distribution of the frequencies of the ones and zeros is delivered to the arithmetic encoder 18 by the analyzer 19 which is accessed by the sampling device 16 with the series of levels and the lengths and, from this, determines current distributions of the likelihood for the occurrence of logical zeros and ones.

In the encoding unit 12 described here; statistical dependencies between the levels and lengths will be taken into consideration in a particular way. These statistical dependencies are based on the fact that large level values occur mostly at the start of the sampling process. Conversely, large length values are more frequent at the end of the sampling process. Since, in accordance with FIG. 3, the transformed prediction error matrix 20 will be sampled with a zig-zag pattern 21 through which initially the low-frequency spectral coefficients and then the higher frequency spectral coefficients will be read out, Large level values then occur above all at the beginning of the sampling process; that is, at the beginning of the series of levels and lengths.

FIG. 4 shows a diagram in which a distribution curve 22 specifies the frequency distribution P(k) depending on the level values k. It generally applies that the likelihood of small level values is greater than that of large level values. The distribution curve 22 thus drops monotonously starting from a maximum value at the level value k=0.

FIG. 5 contains a further diagram showing a distribution curve 23 which specifies the frequency distribution P(k|k=kX) for the likelihood that the level value of k will occur after a level value of k=kX. This distribution curve 23 features a maximum that lies at a value k<kX. As such, after the occurrence of a level value k=kX, lower level values are very likely. This corresponds to the fact that the level values drop towards the end of the sampling process.

Because of the statistical interdependency of the level values, it makes sense to also select the symbol frequencies for the zeros and ones on which the context-adaptive arithmetic encoding in the arithmetic encoder 18 is based depending on the value of the previously encoded level.

The statistical dependencies can be strengthened even more when the level values are sorted according to size. Suitable sorting procedures in which the level values are sorted according to size, and in which the sorting information is transmitted separately, are known to the experts and are not as such part of the present invention. In addition, future sorting processes for the application are also considered in this context.

By sorting the levels, the part of the curve 24 shown in FIG. 5 as a cross-hatched area is truncated to an extent. This strengthens the statistical dependencies of the level values further.

The statistical dependencies do not just relate to the level values but also to the lengths. As already mentioned, large length values particularly occur toward the end of the sampling process. As such, it also makes sense to select the distribution of the frequencies for the zeros and ones on which the arithmetic encoding in the arithmetic encoder 18 is based depending on the value of the previously encoded lengths.

FIGS. 6 and 7 show diagrams of the context sets which are used for encoding the level values and length values.

In FIG. 6, the context sets on which the coding of the sorted level values is based are shown. In the case, n=2 is selected for the number of individually encoded bit positions and m=4 is selected for the number of individually encoded level values. As already mentioned, the encoding of a level value 1 is undertaken depending on the amount of the previously encoded level k.

It should be noted that with the unary representation of sorted level values, the concluding zero used for the unary representation of 1 can be omitted if l==k applies, since the maximum value for 1 is equal to k.

For the first min(n, k) bits, a separate context is used in each case. For all possible following bits up to the maximum length of the unary representation of 1, a collective context will be used. In FIG. 5 this is the collective context for the third and the following bits. Trials have shown 2 to be a good value for n. The leading sign is represented by an individual bit and a specific leading sign context is used for encoding the leading sign. The context set for encoding a level with an amount 1, provided the last encoded level had the amount k, thus includes min(k+1, min(n,k)+2) context and is referred to below as LevelContextSet(k).

For the encoding of the first level read out of the transformed prediction error matrix it is not possible to refer back to a previously encoded level so that the first level value read out must be encoded separately. As a context for the first level value to be encoded, the context of the largest possible level value is assumed, which to some extent is possible by the transformation and the subsequent quantizing.

Otherwise, instead of the different contexts for a k>m, the context for k=m can be used as a collective context. For encoding a level value 1 depending on the previous level value k, the following context set in accordance with FIG. 6 is thus used. LevelContextSet(min(m,k)). Trials have shown m=4 to be a good value.

Basically, however, there is also the option of a dynamically designing the parameters n and m and transmitting the values selected for them in a header.

The encoding of a length r is undertaken depending on the previously encoded length p. The following applies for the first length: p=0. As for the level values, a separate context is also used for the first n bits in each case. For all following bits a common context is used. n=3 has proven itself in trials. The context set for encoding a length r under the condition that the last encoded length has the amount p, is designated below by RunContextSet(p). For encoding a length r depending on p, the following context set will be used: RunContextSet(min(m,p)). In trials m=5 has proved to be a good value.

Basically, there is also the option of dynamically designing the parameter m in this connection and transmitting the values selected for it with the aid of a suitable information element.

Through the method described here in which the contexts used for encoding are selected depending on the previously encoded level value or length value, the data rate can be reduced by 2 to 3%.

A further reduction can be achieved when the end of this sequence of levels and lengths read out from the prediction error matrix is not encoded using the level value 0, but when the sequence is preceded by the number of read out levels different from 0. In the example given above, this would then not produce the sequence (0/2)(1/−1)(2/1) (0/0), but 3(0,2)(1/−1)(2/1).

In this case, the information about the number of level values different from 0 can be used for an efficient encoding of the level values. Because transformed prediction error matrices with a few spectral coefficients differing from 0 have as a rule only spectral coefficients with very low level values. It thus makes sense, depending on the number of spectral coefficients differing from 0, to now switch between the different context sets and thus improve the efficiency of the encoding process.

Alternatively, it is also possible, depending on the amount of the first level values transmitted, to switch between different context sets.

Taking into account the number of coefficients differing from 0 in the encoding by correspondingly adapted context sets, reduces the data rate of the bit stream output at output 6 by a further 5 to 6%.

The devices and methods described here are suitable for use within the framework of existing video standards such as H.263 and MPEG-4, as well as H.26L. The methods and devices described here are, however, also suitable for use in future standards corresponding to the current standards.

The method described here and the devices described here are especially efficient at low data rates since very many levels at low data rates have a value of 1 for the amount. This has not, however, been able to be statistically modelled efficiently thus far since relating the last encoded level value to the range of values of the currently to be encoded level values is not possible without prior knowledge about the sequence of the coefficients.

Finally it should be pointed out that the devices and methods described here can be achieved both in hardware and in software form.

Although the present invention has been described with references to specific embodiments, those of skill in the art will recognize that changes may be made thereto without departing from the spirit and scope of the present invention as set forth in the hereafter appended claims.

The invention claimed is:

1. Method for video coding with the procedural steps:
    provision of a prediction error matrix;
    conversion of the prediction error matrix by coefficient sampling into a series of symbols; and
    performing context-adaptive arithmetic encoding of the symbols on the basis of symbol frequencies, for which the distribution is selected depending on an already encoded symbol;
    wherein:
        the context-adaptive arithmetic encoding of the symbols includes, for a symbol being encoded, selecting from different predetermined distributions of symbol frequencies a particular predetermined distribution of symbol frequencies based on the symbol encoded immediately beforehand; and
        the predetermined distribution of symbol frequencies indicates the likelihood of different types of symbols occurring immediately following the type of the symbol encoded immediately beforehand based on known statistical interdependencies between different types of symbols occurring in succession.

2. Method in accordance with claim 1, in which the prediction error matrix is converted by coefficient sampling into a series of levels and lengths of zero sequences.

3. Method in accordance with claim 2, in which the levels and lengths are represented as unary values.

4. Method in accordance with claim 2, in which the levels are arithmetically encoded context-adaptively in each case, with the distribution of the underlying level value frequencies being selected depending on a level value encoded beforehand in each case.

5. Method in accordance with claim 2, in which the lengths are arithmetically encoded context-adaptively in each case, with the distribution of the underlying length value frequencies being selected depending on the length value encoded beforehand in each case.

6. Method in accordance with claim 2, in which the level values are sorted before the context-adaptive arithmetic encoding in accordance with level values.

7. Method in accordance with claim 1, in which the number of symbols read out for coefficient sampling is encoded and transmitted.

8. Method in accordance with claim 7, in which the selection of the distribution of symbol frequencies is undertaken depending on the number of symbols read out.

9. Computer program product which contains program code, the program code, when loaded on a processor, configure the processor to:
provide a prediction error matrix;
convert the prediction error matrix by coefficient sampling into a series of symbols; and
perform context-adaptive arithmetic encoding of the symbols on the basis of symbol frequencies, for which the distribution is selected depending on an already encoded symbol;
wherein:
the context-adaptive arithmetic encoding of the symbols includes, for a symbol being encoded, selecting from different predetermined distributions of symbol frequencies a particular predetermined distribution of symbol frequencies based on the symbol encoded immediately beforehand; and
the predetermined distribution of symbol frequencies indicates the likelihood of different types of symbols occurring immediately following the type of the symbol encoded immediately beforehand based on known statistical interdependencies between different types of symbols occurring in succession.

10. A device for video coding for a current image represented by macroblocks and part of a bit stream, the device comprising a processor and a machine-readable medium, the machine readable medium including instructions that, when loaded on the processor, configure the processor to:
provide a prediction error matrix;
convert the prediction error matrix by coefficient sampling into a series of symbols; and
perform context-adaptive arithmetic encoding of the symbols on the basis of symbol frequencies, for which the distribution is selected depending on an already encoded symbol;
wherein:
the context-adaptive arithmetic encoding of the symbols includes, for a symbol being encoded, selecting from different predetermined distributions of symbol frequencies a particular predetermined distribution of symbol frequencies based on the symbol encoded immediately beforehand; and
the predetermined distribution of symbol frequencies indicates the likelihood of different types of symbols occurring immediately following the type of the symbol encoded immediately beforehand based on known statistical interdependencies between different types of symbols occurring in succession.

* * * * *